United States Patent
Schmidt

(10) Patent No.: US 8,064,567 B2
(45) Date of Patent: Nov. 22, 2011

(54) METHOD AND DEVICE FOR THE INCREMENTION OF COUNTER STATUSES STORED IN MEMORY CELLS OF A MEMORY

(75) Inventor: Kurt Schmidt, Grafing (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 731 days.

(21) Appl. No.: 12/280,659

(22) PCT Filed: Sep. 26, 2007

(86) PCT No.: PCT/EP2007/008393
§ 371 (c)(1),
(2), (4) Date: Aug. 25, 2008

(87) PCT Pub. No.: WO2008/049497
PCT Pub. Date: May 2, 2008

(65) Prior Publication Data
US 2009/0009524 A1    Jan. 8, 2009

(30) Foreign Application Priority Data

Oct. 26, 2006 (DE) .......................... 10 2006 050 617
Jan. 3, 2007 (DE) .......................... 10 2007 001 043

(51) Int. Cl.
*G06M 3/00* (2006.01)
(52) U.S. Cl. ............................. 377/26; 377/19; 377/20
(58) Field of Classification Search .................. None
See application file for complete search history.

(56) References Cited

U.S. PATENT DOCUMENTS

| | | | |
|---|---|---|---|
| 5,757,364 A | 5/1998 | Ozawa et al. | |
| 5,818,434 A | 10/1998 | Yamamoto et al. | |
| 6,567,340 B1 | 5/2003 | Nataraj et al. | |
| 6,922,456 B2 * | 7/2005 | Greenlaw et al. | 377/26 |
| 7,688,931 B2 * | 3/2010 | Gara et al. | 377/26 |
| 2005/0081101 A1 | 4/2005 | Love et al. | |
| 2005/0222788 A1 | 10/2005 | Ortler et al. | |
| 2006/0209081 A1 | 9/2006 | Shepherd et al. | |
| 2010/0305984 A1 * | 12/2010 | Ben-Yitschak et al. | 705/6 |

OTHER PUBLICATIONS

International Search Report for PCT/EP2007/008393 dated Feb. 12, 2008.

* cited by examiner

*Primary Examiner* — Tuan T Lam
(74) *Attorney, Agent, or Firm* — Marshall, Gerstein & Borun LLP

(57) ABSTRACT

A method for the incrementation of counter statuses in memory cells, which are arranged respectively in rows and columns of a first memory adds a "1" to the memory content of a memory cell of a second memory, which corresponds to the memory cell at the start of a sequence of memory cells to be incremented in a row or column of the first memory in the case of every incrementation of a sequence of memory cells of the first memory, and adds a "−1" to the memory content of a memory cell of the second memory, which corresponds to the memory cell immediately following the memory cell at the end of the sequence of memory cells to be incremented associated with the start of the sequence, in the case of every incrementation of a sequence of memory cells of the first memory. It then recursively adds the memory content of a memory cell arranged in a row or column of the second memory to the memory content of the memory cell arranged in the next lower row or column of the first memory and stores the result of the addition in the memory cell arranged in the row or column of the first memory.

9 Claims, 4 Drawing Sheets

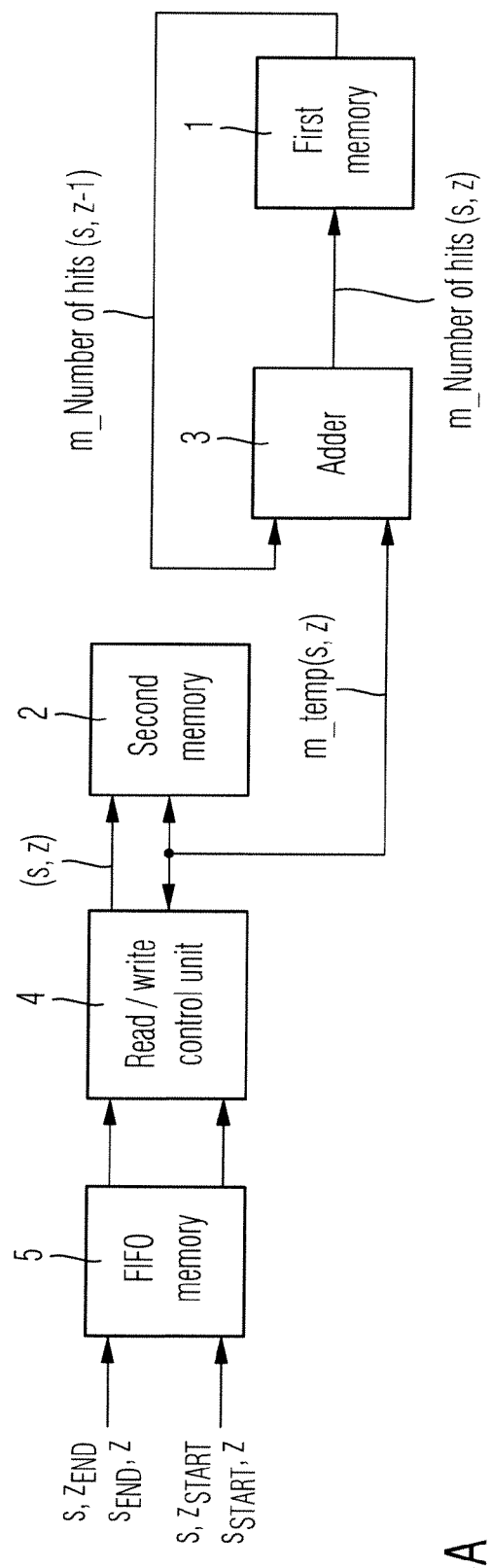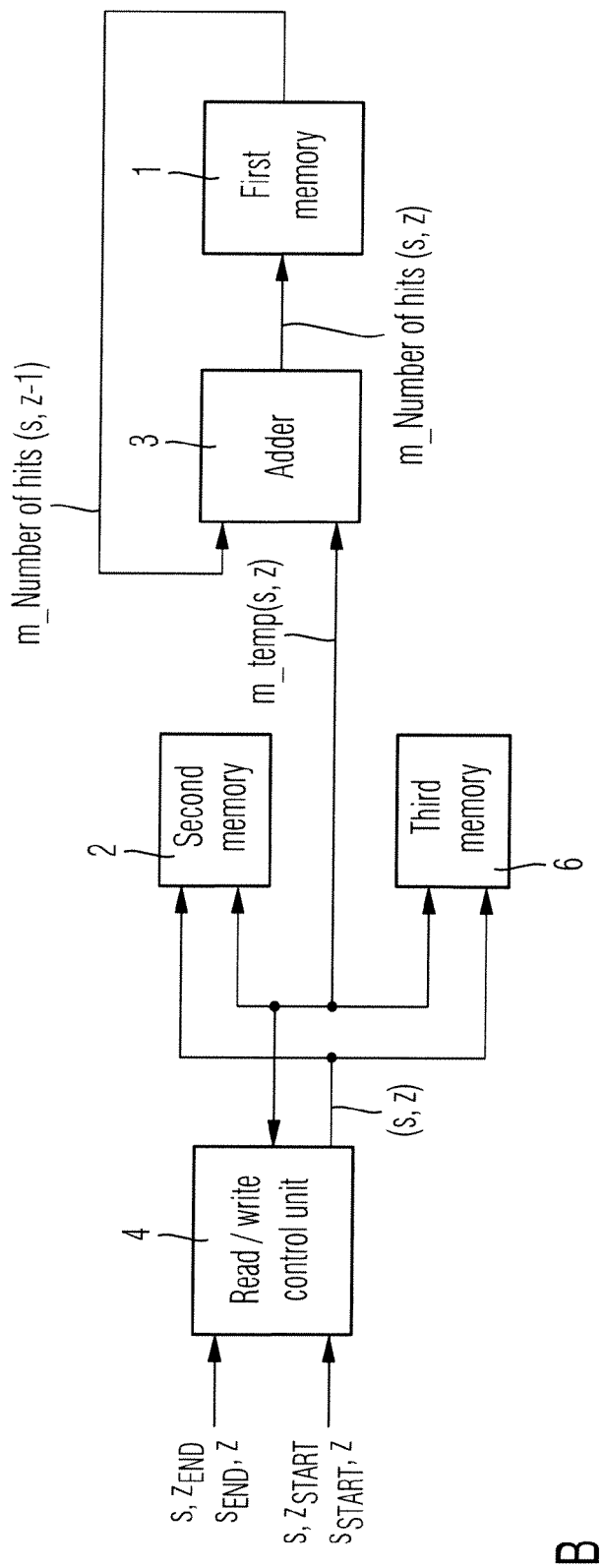
Fig. 3A
Fig. 3B

Legend:

Decrement memory

Increment memory

| Measuring cycle | Second memory (m_temp(s, z)): | First memory (m_Number of hits (s, z)): |
|---|---|---|
| Initialisation | all 00 (7×9 grid) | — |
| 1 | grid with 11 at row 2 col 5; bottom two rows: 11 11 11 11 01 11 11 11 11 / 01 01 01 01 00 01 01 01 01 | — |
| 2 | grid with 10 at row 2 col 5; bottom two rows: 10 10 10 10 10 10 10 10 10 / 10 10 10 10 00 10 10 10 10 | — |
| 3 | grid with 01 at row 2 col 5; bottom two rows: 01 01 01 01 11 01 01 01 01 / 11 11 11 11 00 11 11 11 11 | 00 00 00 00 00 00 00 00 00 / 00 00 00 00 00 00 00 00 00 / 00 00 00 00 11 00 00 00 00 / 00 00 00 00 11 00 00 00 00 / 00 00 00 00 11 00 00 00 00 / 11 11 11 11 00 11 11 11 11 |

METHOD AND DEVICE FOR THE INCREMENTION OF COUNTER STATUSES STORED IN MEMORY CELLS OF A MEMORY

BACKGROUND OF THE INVENTION

1. Field of the Invention

The invention relates to a method and a device for the incrementation of counter statuses stored in memory cells of a memory.

2. Related Technology

By way of example for the current state of organization of screen memories, reference is made to US 2006/0209081 A1.

Contemporary measuring devices and systems provide a display of level-value distributions for a signal to be measured over frequency or time. For this purpose, it is determined in each case whether a level value of the signal to be measured is present within a given time raster in the respective level range and with the respective value of the frequency or time raster. If a level value of the measured signal is present, a counter associated with the respective level range and the respective value of the frequency or time raster is incremented. At the end of the measurement time, the counter statuses of all counters are read out, and supplied to the display device in order to update the display.

The counter statuses of the counters associated with the individual level ranges and the individual values of the frequency or time raster are stored in the memory cells of a memory connected upstream of the display device. Several adjacent memory cells in a row or in a column of the memory are typically incremented at the same time (for example, in the case of a constant signal level, over a broad frequency or time range or, in the case of an equally high frequency of occurrence of the frequency or time value, in adjacent signal-level ranges).

In the worst-case, all of the memory cells in a row or a column of the memory must be incremented in every measuring cycle, which leads to an extremely-high access rate to the memory, which is significantly higher than the sampling rate of the sampled measured signal. At the present time, this kind of incrementation of memory cells of a memory in real time cannot yet be realized with a currently-available resolution of the display device—typically 1000·600 pixels—and with a high sampling rate of the sampled measured signal—for example, a few hundred MHz.

SUMMARY OF THE INVENTION

The invention therefore provides a method and a device for the efficient incrementation in real time of counter statuses, which are stored respectively in a memory cell of a memory connected upstream of a display device.

The invention device for the incrementation of counter statuses stored in memory cells of a memory with the features of claim 6 provides a method for the incrementation of counter statuses in memory cells, which are arranged in rows and columns of a first memory, comprising:

adding a constant m to the memory content of a memory cell of a second memory, which corresponds to the memory cell at a beginning of a sequence of memory cells to be incremented within a row or column of the first memory, with every incrementation of a sequence of memory cells of the first memory;

adding a constant −m to the memory content of a memory cell of the second memory, which corresponds to the memory cell immediately following the memory cell at the end of the sequence of memory cells to be incremented associated with the beginning of the sequence, with every incrementation of a sequence of memory cells of the first memory;

finally recursively adding the memory content of a memory cell arranged within a row or column of the second memory to the memory content of the memory cell arranged in the next lower row or column of the first memory and storing the result of the addition in the memory cell arranged in the row or column of the first memory.

The invention also provides a device for the incrementation of counter statuses in memory cells, which are arranged within a row or column of a first memory, with a first memory with stored counter statuses, a second memory with memory cells corresponding to the memory cells of the first memory, in which the difference between the number of incrementations to be implemented in the respective memory cell and the number of incrementations to be implemented in the memory cell arranged the next lower row or column is stored respectively, and with an adder disposed between the first memory and the second memory for the recursive addition of the memory content of the respective memory cell of the second memory to the memory content of the memory cell arranged respectively in the next lower row or column of the first memory and for the storage of the result of the addition in the respective memory cell of the first memory.

According to the invention, if several counter statuses of memory cells, which are each arranged adjacent to one another in rows or columns of a first memory connected upstream of the display device, must be incremented within a given measuring cycle, only those memory cells are marked in a second memory connected upstream of the first memory, which correspond to those memory cells of the first memory, which are positioned at the beginning and end of the sequence of adjacent memory cells to be incremented. In this context, a constant m, e.g. "1", is added to the memory content of the memory cell of the second memory, which corresponds to the memory cell of the first memory at the beginning of the sequence of memory cells to be incremented; and the negative constant −m, e.g. "−1" is added to the memory content of the memory cell of the second memory, which corresponds to the memory cell of the first memory following at the end of the sequence of memory cells to be incremented.

After a given number of measuring cycles—typically up to $2^{18}$—, in each case for all memory cells of the first memory, the memory content of the memory cell of the second memory corresponding to the memory cell of the first memory is added according to the invention to the memory content of that memory cell of the first memory, which is positioned respectively in the next lower row or column of the first memory, and stored, in each case after the addition, in the memory cell of the first memory. Following this, the memory cells of the second memory are reset.

With a sequence of adjacent memory cells to be incremented within a row or column of the first memory, the number of incrementations is reduced to a single incrementation—addition of m or respectively "1"—of the memory cell of the second memory corresponding to the memory cell at the beginning of the sequence of memory cells to be incremented in the first memory and a single decrementation—addition of −m or respectively "−1"—of the memory cell of the second memory corresponding to the memory cell following the memory cell at the end of the sequence of memory cells to be incremented in the first memory. When the counter statuses in several measuring cycles are to be incremented within a sequence of adjacent memory cells of the first memory, only a single incrementation and a single decrementation needs to be implemented each time.

In a first embodiment of the device according to the invention, to ensure that the time delay, which is caused by the recursive addition of the updating of all memory cells of the first memory and by the resetting of all memory cells of the second memory, does not obstruct the renewed incrementation or decrementation of the memory cells of the second memory in view of the continuously-sampled measured signal, a first-in-first-out memory is connected upstream of the second memory, which buffers the information for the incrementation of the individual memory cells of the first memory, until the recursive addition of the updating of all memory cells of the first memory and the resetting of all memory cells of the second memory has been concluded. In a second embodiment of the device according to the invention, a third memory is provided, which is connected in parallel to the second memory and, in cyclical alternation with the second memory, contains the number of incrementations to be implemented within a measuring cycle in the individual memory cells of the first memory.

BRIEF DESCRIPTION OF THE DRAWINGS

The following section explains in detail with reference to the drawings one exemplary embodiment of the method according to the invention and the device according to the invention for the incrementation of counter statuses stored in memory cells of a memory. The drawings are as follows:

FIG. 3A shows a block-circuit diagram of a first embodiment of the device according to the invention for the incrementation of counter statuses stored in memory cells of a memory;

FIG. 3B shows a block-circuit diagram of a second embodiment of the device according to the invention for the incrementation of counter statuses stored in memory cells of a memory.

DETAILED DESCRIPTION

In the following section, the mathematical basis required for an understanding of the method according to the invention and the device according to the invention for the incrementation of counter statuses stored in memory cells of a memory is derived with reference to FIG. 1.

Figure 1:
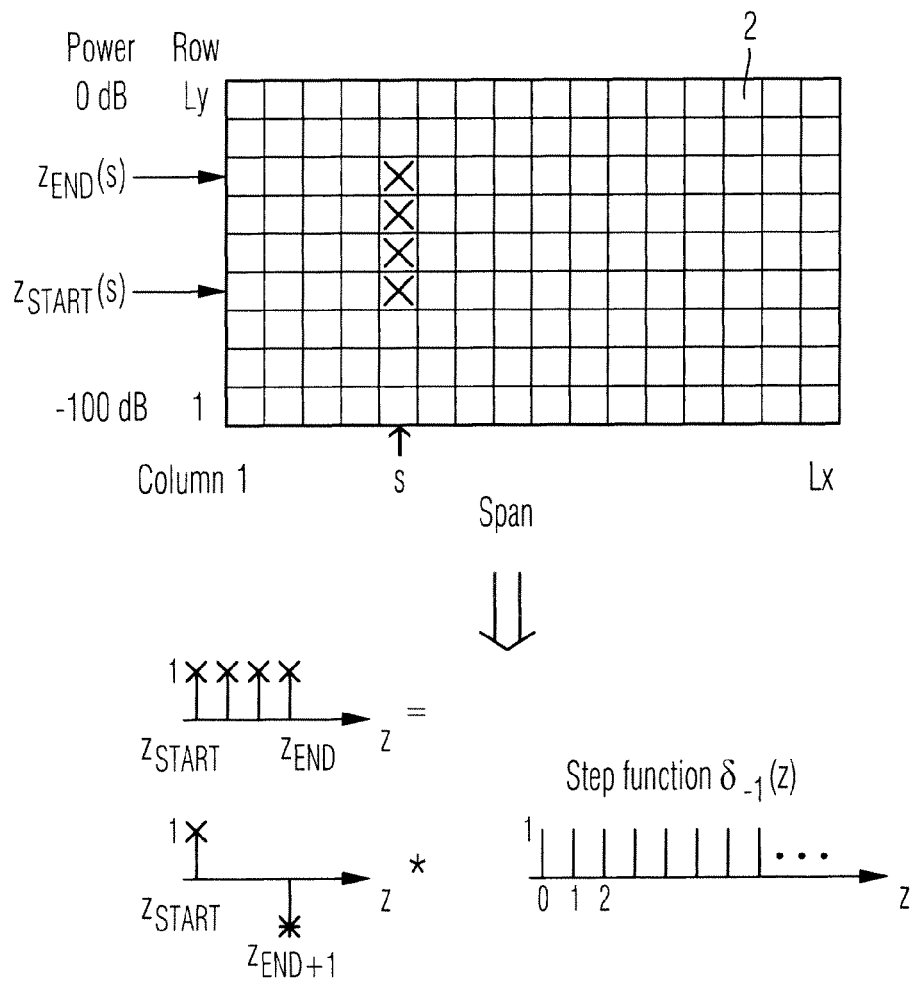
FIG. 1 shows a diagram of the principal idea of the method according to the invention and the device according to the invention for the incrementation of counter statuses stored in memory cells of a memory.
Figure 1:
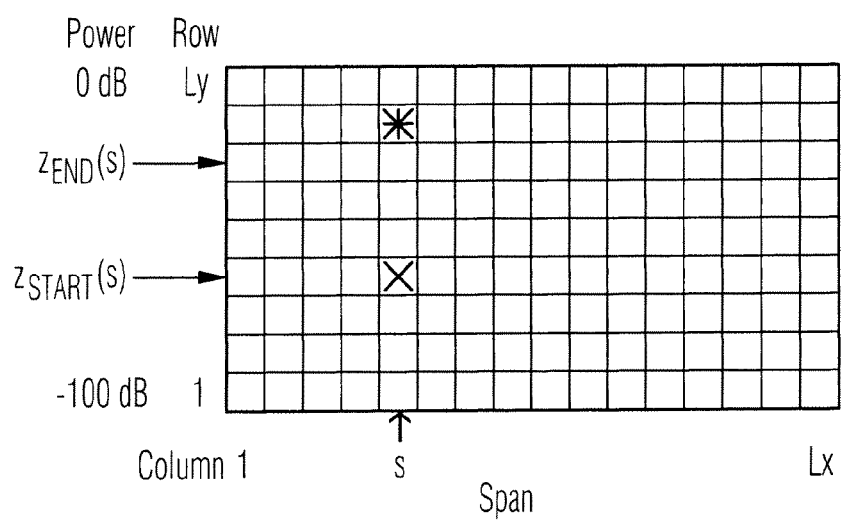

As presented in the upper part of FIG. 1, the following section assumes by way of example an incrementation of the counter statuses in a sequence of memory cells, which are arranged in a column s of the first memory 1. For this purpose, the memory cells of the second memory 2 corresponding to the sequence of memory cells of the column s of the first memory 1 are marked, for example, by storing a "1". However, any required constant +m can be used instead of a "1". The incrementation of a sequence of memory cells arranged in a row of the first and second memory 1 and 2 is treated in a similar manner and is also covered by the invention. The incrementation of the counter statuses in a sequence of memory cells arranged in a row z of the first memory is implemented in a similar manner.

The sequence rec(z) of memory cells of the first memory 1 disposed between the lower row $z_{start}$ and the upper row $z_{end}$ in the column s, which are incremented simultaneously within a measuring cycle, and of which the corresponding memory cells of the second memory 2 are each marked, for example with the value "1", can be interpreted mathematically as a convolution result of a Dirac impulse $\delta_0(z)$ in the row $z_{start}$ with the value "1" and of a Dirac impulse $\delta_0(z)$ in the row $z_{end}+1$ with the value "-1" (in general with the constant -m) with the sequence representing a step function of "1" values as shown in equation (1)

$$rec(z) = [\delta_0(z - z_{start}) - \delta_0(z - z_{end} - 1)] * \delta_{-1}(z) \tag{1}$$

In this manner, the marking in the second memory 2 is reduced to a definition of the memory cell in the row $z_{start}$ and in the column s with the value "1" (in general +m) and of the memory cell in the row $z_{end}+1$ and in the column s with the value "-1" (in general -m) instead of a definition of the memory cells between the rows $z_{start}$ and $z_{end}$ in the column s with the value "1".

As an alternative, the convolution according to equation (1) can be implemented as a summation according to equation (2) over the memory contents stored in the memory cells of the column s beginning with row 1:

$$rec(z) = \sum_{\alpha=1}^{z} [\delta_0(\alpha - z_{start}) - \delta_0(\alpha - z_{end} - 1)] \tag{2}$$

According to equation (3), in every measuring cycle β, the memory cell in the column s and the row $z_{start}(\beta)$, which represents the beginning of the sequence of memory cells to be incremented of the first memory 1, is defined with the value +m or respectively "1", and the memory cell in the column s and in the row $z_{end}(\beta)+1$ following the row $z_{end}(\beta)$, which represents the end of the sequence of memory cells to be incremented of the first memory, is defined with the value -m or respectively "-1". After a total of v measuring cycles, the number m_NofTreffer(s,z) of incrementations to be implemented in the memory cell of row z and column s of the first memory 1 is obtained for all Lx columns of the first and second memory according to equation (3):

$$m\_NofTreffer(s, z) = \sum_{\beta=1}^{v} \sum_{\alpha=1}^{z} [\delta_0(\alpha - z_{start}(\beta)) - \delta_0(\alpha - z_{end}(\beta) - 1)] \tag{3}$$

for all $1 \leq s \leq Lx$

Since the two-dimensional summation in equation (3) for determining the number m_NofTreffer(s,z) of incrementations to be implemented in the memory cell of row z and column s of the first memory 1 is comparatively complex, the invention exploits the fact that the Dirac functions $\delta_0(\alpha - z_{start}(\beta))$ and $\delta_0(\alpha - z_{end}(\beta) - 1)$ in equation (3) provide values diverging from zero only if the running variable α provides the values $z_{start}(\beta)$ and $z_{end}(\beta)+1$ respectively. To this extent, for every column s of the first memory, only those memory cells with a value of the Dirac functions $\delta_0(\alpha - z_{start}(\beta))$ and $\delta_0(\alpha - z_{end}(\beta) - 1)$, which differs from zero, must be determined and marked according to the invention.

Since a marking of this kind applies not only for the marked memory cell, but, corresponding to equation (3), for all memory cells in a correspondingly-higher row of the same column s of the first memory 1, according to the invention, a renewed determination of the marking for all memory cells positioned in higher rows of the same column of the first memory 1 is not required after the storage of the marking in the marked memory cell of column s. As will be shown below, the function of the equation (3) can therefore be broken down according to the invention into the two functions presented in equations (4) and (5).

In the individual measuring cycles, in each case, according to the invention, the value "1" is added in the memory cell of column s of the first memory 1, if the occurring Dirac function $\delta_0(\alpha-z_{start}(\beta))$ with the running index $\alpha$ associated with the memory cell provides the value "1", and the value "−1" is added in the memory cell of column s of the first memory, if the occurring Dirac function $\delta_o(\alpha-z_{end}(\beta)-1)$ with the running index $\alpha$ associated with the memory cell provides the value "1".

According to equation (4), within the respective measuring cycle $\beta$, the memory content m_temp(s,z) of the memory cell in column s and in row $z_{start}(\beta)$ of the second memory 2 is therefore incremented, and the memory content m_temp(s,z) of the memory cell in column s and in row $z_{end}(\beta)$ of the second memory 2 is decremented for all Lx columns and all Ly rows of the second memory.

$$m\_temp(s,z)=m\_temp(s,z)+\delta_0(z-z_{start}(\beta))-\delta_0(z-z_{end}(\beta)-1) \text{ for all } 1\leq z\leq Ly \text{ and all } 1\leq s\leq Lx \quad (4)$$

Following this, according to the invention, for every memory cell in column of the first memory, the added "1"— and "−1" values—corresponding to the incrementations or respectively decrementations of the increments or respectively decrements to be implemented in the memory cells of the first memory 1—summated in the memory cells in the respectively lower rows and in column s of the first memory, are added. For this purpose, for every memory cell, in a row of column of the first memory 1, the "1" and "−1" values summated for the respective memory cell are added to the "1" and "−1" values summated in the memory cells in all of the respectively lower rows of column s of the first memory 1, which corresponds to a recursive addition.

Accordingly, starting in the memory cell in the first row and in column s, the counter status m_NofTreffer(s,z−1) summated up to the end of the respective observation interval in the memory cell in the next lower row and in the column s of the first memory 1—corresponding to the frequency of occurrence of level values of the measured signal in the respective level range and up to the respective value of the time or frequency raster up to the end of the respective observation interval—is added recursively to the number m_temp(s,z) of "1" and "−1" values summated up to the end of the respective observation interval in the memory cell in the row z and in column s of the second memory 2—corresponding to the incrementations or respectively decrementations determined and to be implemented up to the end of the respective observation interval for the updating of the counter status m_NofTreffer(s,z) in the respective memory cell of the first memory—for all Lx columns and all Ly rows of the first memory 1 according to equation (5).

$$m\_NofTreffer(s,z)=m\_NofTreffer(s,z-1)+m\_temp(s,z) \text{ for all } 1\leq z\leq Ly \text{ and all } 1\leq s\leq Lx \quad (5)$$

Figure 2:
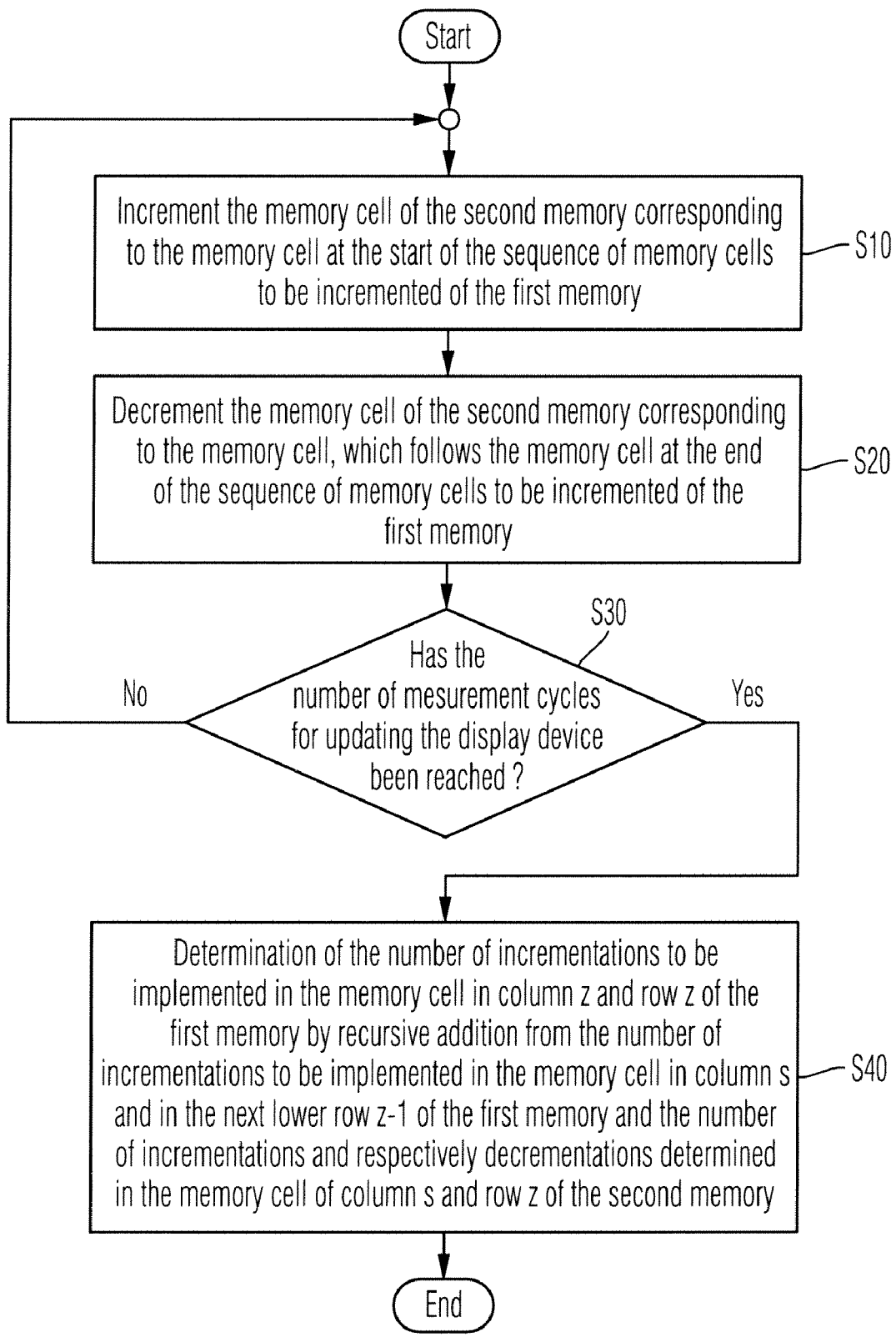
FIG. 2 shows a flow chart of the method according to the invention for the incrementation of counter statuses stored in memory cells of a memory.

The method according to the invention for the incrementation of counter statuses stored in memory cells of a memory is obtained starting from the mathematical equations (1) to (5), as presented in FIG. 2.

In the first procedural stage S10, starting from the level value determined at a given time and/or frequency value from the measured signal sampled in a pre-processing unit of the measuring device or respectively system and its allocation to a given level range, the pixel of the display device associated with the respective level range and the respective value of the time and/or frequency raster and the associated memory cell in a first memory 1 connected upstream of the display device is determined. In this context, in particular, if several memory cells of the first memory 1 adjacent to one another in a row or column are determined, the memory content m_temp(s,z) of that memory cell of a second memory 2, which corresponds to the memory cell positioned at the beginning of the sequence of determined memory cells of the first memory is incremented according to equation (4) by the value "1".

In the following explanation, the left-hand end of the memory cells adjacent in a row, or respectively, the lower end of the memory cells adjacent in a column is regarded as the beginning of the sequence of adjacent memory cells of the first memory 1. However, as an alternative, the right-hand end of the memory cells adjacent in a row, or respectively the upper end of the memory cells adjacent in a column can be regarded as the beginning, and this alternative is also covered by the invention. With regard to this perspective, the recursive addition or respectively the convolution/summation should begin in the memory cell in the highest row of the column s or respectively in the highest column of the row z of the first or respectively second memory. Accordingly, the value "−1" must be replaced by the value "+1" in equations (1) to (5) for this perspective.

In the next procedural stage S20, in a similar manner to the first procedural stage S10, the memory content m_temp(s,z) of the memory cell of the second memory 2, which corresponds to the memory cell of the first memory 1 immediately following the memory cells to be incremented at the end of the sequence in the first memory, is decremented according to equation (4) by the value "1".

In the next procedural stage S30, it is determined whether the number of measuring cycles already implemented corresponds to the number of measuring cycles required for a new update of the display device. If this is not the case, the memory cells to be incremented in the first memory 1 are determined respectively in a further measuring cycle, and, with a resumption of the first procedural stage S10, the memory cell of the second memory 2 corresponding to the memory cell at the beginning of a sequence of memory cells to be incremented in the first memory 1 is incremented by the value "1".

By contrast, in the next and final procedural stage S40, if the number of measuring cycles required for an update of the display device has been implemented, the number m_NofTreffer(s,z) of incrementations of the memory cell in column s and in row z of the first memory 1 is determined by a recursive addition of the number m_NofTreffer(s,z−1) of incrementations of the memory cell in column s and in the next lower row z−1 of the first memory 1 and of the incrementations added to one another in each case, or respectively, of the decrementations m_temp(s,z) subtracted from one another in each case in the memory cell in column s and in row z of the second memory 2 according to equation (5).

The first embodiment of the device according to the invention for the incrementation of counter statuses stored in memory cells of a memory as illustrated in FIG. 3A includes of a first memory 1, in the memory cells of which the frequencies of occurrence of level values measured respectively at the individual level ranges and at the individual values of the time or frequency raster in the individual measuring cycles are stored.

An adder 3 is connected upstream of the first memory 1, which, in the case of incrementations or respectively decrementations determined within the last time interval of several measuring cycles for a memory cell of the first memory 1, adds the number of incrementations or respectively decrementations determined, which are stored in the memory cell of the second memory 2 corresponding to the memory cell of the first memory 1, to the memory content of the memory cell of the first memory 1 with the frequency value contained therein.

A read/write control unit 4 is connected upstream of the second memory 2, which, in the case of an incrementation to be implemented within a measuring cycle in a given memory cell of the first memory 1, writes the value "1" to the corresponding memory cell of the second memory 2 and, after a given number of measuring cycles, if the memory contents of the first memory 1 have been written to the display device, re-initializes or respectively resets all memory cells of the second memory 2 to the value "0".

In the exemplary embodiment, a FIFO (first-in-first-out) memory 5, that is to say a memory 5, in which the element first written to the memory is also the first element to be read out, is connected upstream of the read/write control unit 4, in order to avoid a congestion of data at the input of the second memory 2 resulting from different operating times in the second memory 2—initialization of all memory cells is more time-consuming than writing increments or decrements to individual memory cells.

In a second embodiment of the device according to the invention for the incrementation of counter statuses stored in memory cells of a memory as illustrated in FIG. 3B, a third memory 6, which is connected in parallel to the second memory 2 and controlled by the identical read/write control unit 4, is used instead of the FIFO memory 5. In this context, increments or respectively decrements are written to one of the two memories—second memory 2 or third memory 6—in cyclical alternation over several measuring cycles, while the respectively other one of the two memories is re-initialized. In this manner, the comparatively time-consuming initialization of the second or third memory 2 or 6 is parallelized over several measuring cycles with the writing of increments to the second or respectively third memory 2 or 6, which does not proceed substantially faster.

Figure 4:
FIG. 4 shows an exemplary memory definition of the first and second memory of the device according to the invention for the incrementation of counter statuses stored in memory cells of one of the memories.
Figure 4:

FIG. 4 shows an exemplary memory definition of the first memory 1 and of the second memory 2 over a total of three measuring cycles, wherein, for reasons of logical presentation, increments or respectively decrements are written to the same memory cells of the second memory 2 in all three measuring cycles. The drawing clearly illustrates the summation of the individual increments or respectively decrements in the second memory 2 through the individual measuring cycles and the counter statuses of the corresponding memory cells of the first memory 1 at the end of the third measuring cycle, which represent the frequency distribution of the measured signal over the individual level ranges and the individual values of the time or frequency raster within a measuring interval consisting of three measuring cycles between two updates of the display device.

The invention is not restricted to the embodiment presented. In particular, the simultaneous incrementation of a sequence of memory cells arranged in a row and at the same time in a column of the memory is also covered by the invention.

The invention claimed is:

1. Method for the incrementation of counter statuses in memory cells, which are arranged in rows and columns of a first memory, comprising:
adding a constant m to the memory content of a memory cell of a second memory, which corresponds to the memory cell at a beginning of a sequence of memory cells to be incremented within a row or column of the first memory, with every incrementation of a sequence of memory cells of the first memory;
adding a constant −m to the memory content of a memory cell of the second memory, which corresponds to the memory cell immediately following the memory cell at the end of the sequence of memory cells to be incremented associated with the beginning of the sequence, with every incrementation of a sequence of memory cells of the first memory;
finally recursively adding the memory content of a memory cell arranged within a row or column of the second memory to the memory content of the memory cell arranged in the next lower row or column of the first memory and storing the result of the addition in the memory cell arranged in the row or column of the first memory.

2. Method according to claim 1, wherein +m=+1 and −m=−1.

3. Method for incrementation according to claim 1, comprising adding the memory cells of the second memory with +1 or respectively −1 in the case of a sequence of memory cells to be incremented within a row of the first memory according to the following formula:

$$m\_temp(s,z) = m\_temp(s,z) + \delta_0(z - z_{start}) - \delta_0(z - (z_{end}+1))$$
for all $1 \leq z \leq Ly$ and adding the two memory cells of the second memory in the case of a sequence of memory cells to be incremented within a column of the first memory is implemented according to the following formula:

$$m\_temp(s,z) = m\_temp(s,z) + \delta_0(s - s_{start}) - \delta_0(s - (s_{end}+1))$$
for all $1 \leq s \leq Lx$ wherein
s denotes the column index of the memory cells of the first and respectively second memory or,
z denotes the row index of the memory cells of the first and respectively second memory or,
m_temp(s,z) denotes the memory content of the memory cell in the s-th column and in the z-th row of the second memory,
$z_{start}$ denotes the row index at the start of the sequence of memory cells to be incremented arranged in a column of the first memory,
$z_{end}$ denotes the row index at the end of the sequence of memory cells to be incremented arranged within a column of the first memory,
$s_{start}$ denotes the column index of the start of the sequence of memory cells to be incremented arranged within a row of the first memory,
$s_{end}$ denotes the column index at the end of the sequence of memory cells to be incremented arranged within a row of the first memory,
Ly denotes the number of lines in the first and respectively second memory or,
Lx denotes the number of columns in the first and respectively second memory or, and
$\delta_0(.)$ denotes the Dirac function.

4. Method for incrementation according to claim 3, comprising recursively adding the memory content of a memory cell arranged in a row of the second memory to the memory content of the memory cell arranged in the next lower row of the first memory and storing the result of the addition in the memory cell arranged within the row of the first memory according to the formula:

$$m\_NofTreffer(s,z) = m\_NofTreffer(s,z-1) + m\_temp(s,z)$$
for all $1 \leq z \leq Ly$ and all $1 \leq s \leq Lx$ and recursively adding the memory content of a memory cell arranged in a column of the second memory to the memory content of the memory cell arranged in the next lower column of the first memory and storing the result of the addition in the memory cell arranged within the column of the first memory according to the following formula:

$$m\_NofTreffer(s,z) = m\_NofTreffer(s-1,z) + m\_temp(s,z)$$
for all $1 \leq s \leq Lx$ and all $1 \leq z \leq Ly$ wherein $m\_NofTreffer(s,z)$ denotes the memory content of the memory cell in the s-th column and in the z-th row of the first memory.

5. Method for incrementation according to claim 1, comprising resetting-the memory cells of the second memory after the recursive addition.

6. Device for the incrementation of counter statuses in memory cells, which are arranged within a row or column of a first memory, comprising a first memory with stored counter statuses,
a second memory with memory cells corresponding to the memory cells of the first memory, in which the difference between the number of incrementations to be implemented in the respective memory cell and the number of incrementations to be implemented in the memory cell arranged the next lower row or column is stored respectively, and
an adder disposed between the first memory and the second memory for the recursive addition of the memory content of the respective memory cell of the second memory to the memory content of the memory cell arranged respectively in the next lower row or column of the first memory and for the storage of the result of the addition in the respective memory cell of the first memory.

7. Device for the incrementation of counter statuses according to claim 6, comprising a first-in-first-out memory for buffering the incrementations to be implemented respectively in the memory cells of the first memory is connected upstream of the second memory.

8. Device for the incrementation of counter statuses according to claim 6, comprising a third memory connected in parallel to the second memory for the alternating storage of the incrementations to be implemented respectively in the memory cells of the first memory.

9. Device for the incrementation of counter statuses according to claim 8, comprising a read/write control unit for controlling the storage and readout of the incrementations and for the resetting to be implemented respectively in the memory cells of the first memory provided additionally in at least one of the second memory and in the third memory.

* * * * *